(12) United States Patent
Yang et al.

(10) Patent No.: US 11,637,069 B2
(45) Date of Patent: Apr. 25, 2023

(54) SEMICONDUCTOR DEVICE WITH V2V RAIL AND METHODS OF MAKING SAME

(71) Applicant: TAIWAN SEMICONDUCTOR MANUFACTURING COMPANY, LTD., Hsinchu (TW)

(72) Inventors: Jung-Chan Yang, Hsinchu (TW); Chi-Yu Lu, Hsinchu (TW); Hui-Zhong Zhuang, Hsinchu (TW); Chih-Liang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 20 days.

(21) Appl. No.: 17/220,345

(22) Filed: Apr. 1, 2021

(65) Prior Publication Data

US 2022/0068816 A1 Mar. 3, 2022

Related U.S. Application Data

(60) Provisional application No. 63/072,545, filed on Aug. 31, 2020.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76895* (2013.01); *H01L 21/823475* (2013.01);
(Continued)

(58) Field of Classification Search
CPC .......................... H01L 23/5386; H01L 23/535
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |

(Continued)

FOREIGN PATENT DOCUMENTS

| CN | 110991139 | 4/2020 |
| KR | 20200008524 | 1/2020 |

(Continued)

OTHER PUBLICATIONS

Office Action dated Apr. 20, 2022 for corresponding case No. TW 11120382900. (pp. 1-3).
Office Action dated May 31, 2022 for corresponding case No. KR 10-2021-0069239. (pp. 1-5).

*Primary Examiner* — Farun Lu
(74) *Attorney, Agent, or Firm* — Hauptman Ham, LLP

(57) ABSTRACT

A semiconductor device including: an active region; first, second and third metal-to-drain/source (MD) contact structures which extend in a first direction and correspondingly overlap the active region; a via-to-via (V2V) rail which extends in a second direction perpendicular to the first direction, and overlaps the first, second and third MD contact structures; a first conductive segment which overlaps the V2V rail, is in a first metallization layer, and, relative to the second direction, overlaps each of the first, second and third MD contact structures; and a first via-to-MD (VD) structure between the first MD contact structure and the first conductive segment, the first VD structure electrically coupling the first conductive segment, the V2V rail and the first MD contact structure; wherein at least one of the second or third MD contact structures is electrically decoupled from the V2V rail.

20 Claims, 9 Drawing Sheets

(51) Int. Cl.
   *H01L 29/40*      (2006.01)
   *H01L 29/417*     (2006.01)
   *H01L 23/522*     (2006.01)
   *H01L 21/8234*    (2006.01)
   *H01L 23/538*     (2006.01)
   *H01L 27/02*      (2006.01)
   *H01L 23/528*     (2006.01)

(52) U.S. Cl.
   CPC ........ *H01L 23/528* (2013.01); *H01L 23/5221* (2013.01); *H01L 23/5286* (2013.01); *H01L 23/5386* (2013.01); *H01L 27/0207* (2013.01); *H01L 29/401* (2013.01); *H01L 29/41725* (2013.01)

(56) References Cited

U.S. PATENT DOCUMENTS

| | | | |
|---|---|---|---|
| 2012/0074467 A1* | 3/2012 | Abe | H01L 27/11565 257/E23.141 |
| 2014/0040838 A1 | 2/2014 | Liu et al. | |
| 2015/0278429 A1 | 10/2015 | Chang | |
| 2020/0020699 A1 | 1/2020 | Fujiwara et al. | |
| 2020/0104447 A1 | 4/2020 | Peng et al. | |
| 2020/0134123 A1 | 4/2020 | Wang et al. | |

FOREIGN PATENT DOCUMENTS

| | | |
|---|---|---|
| KR | 20200037109 | 4/2020 |
| TW | 201913842 | 4/2019 |
| TW | 201924023 | 6/2019 |
| TW | 202006915 | 2/2020 |

* cited by examiner

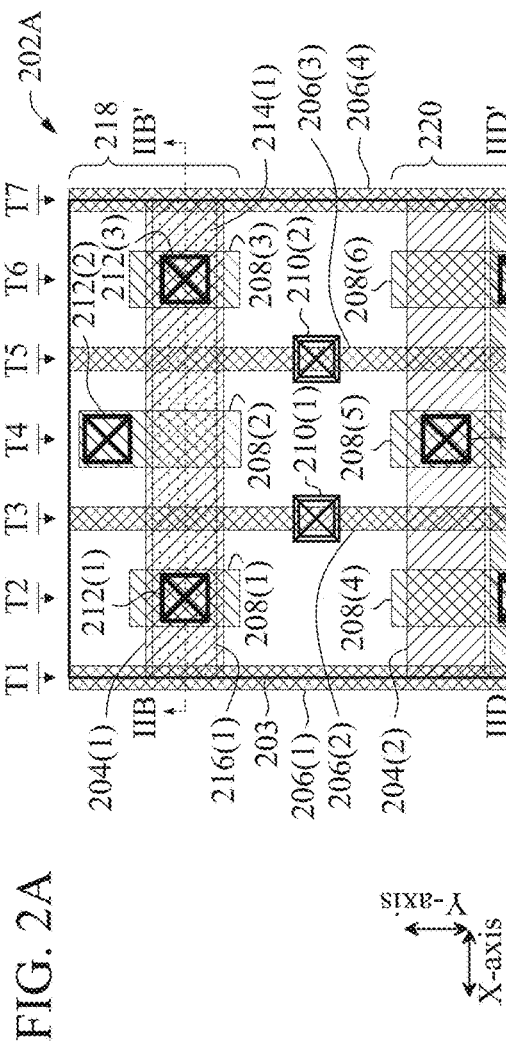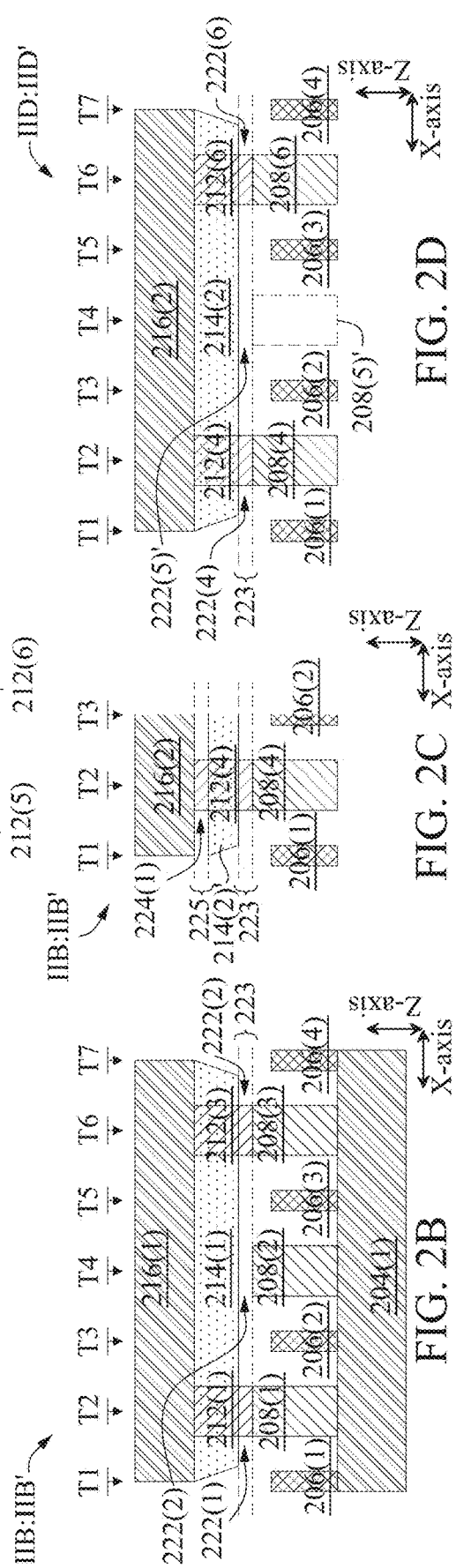
FIG. 2A
FIG. 2B
FIG. 2C
FIG. 2D

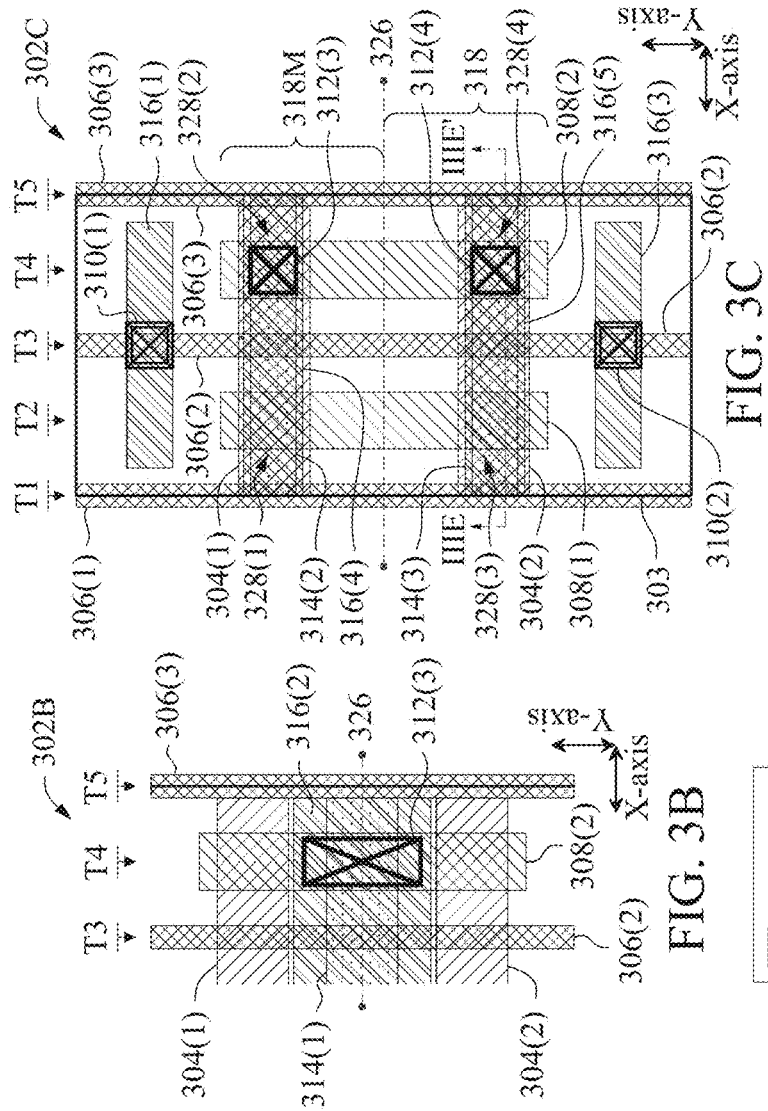
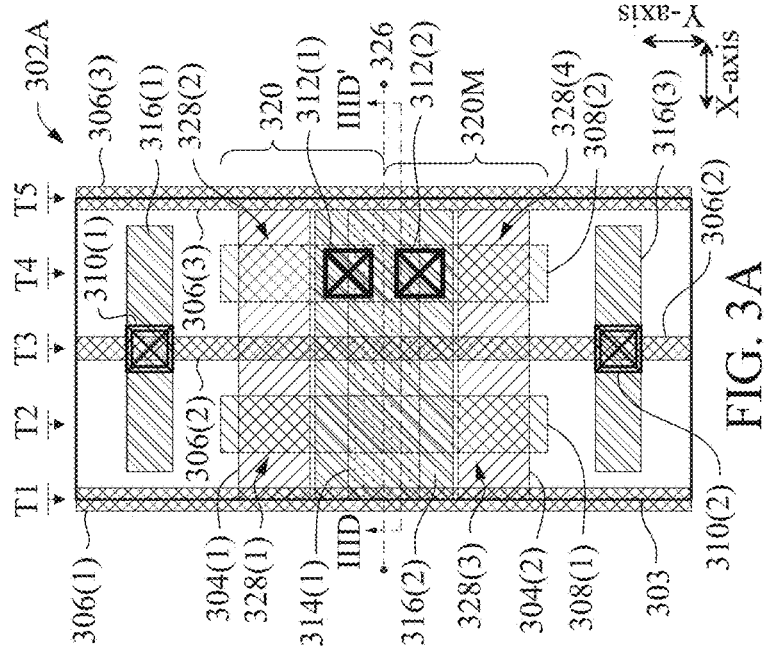
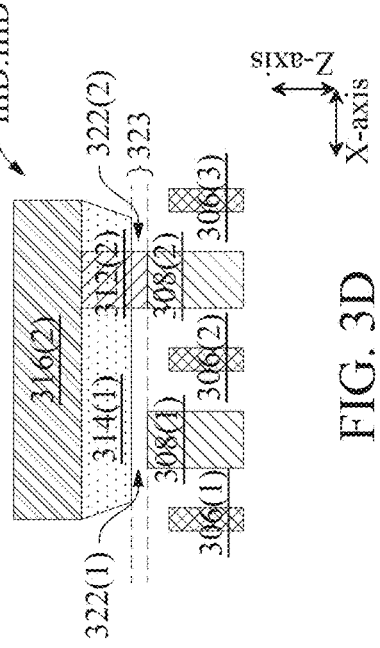
FIG. 3A  FIG. 3B  FIG. 3C  FIG. 3D  FIG. 3E

US 11,637,069 B2

SEMICONDUCTOR DEVICE WITH V2V RAIL AND METHODS OF MAKING SAME

PRIORITY

The present application claims the priority of U.S. Provisional Application No. 63/072,545, filed Aug. 31, 2020, which is incorporated herein by reference in its entirety.

BACKGROUND

An integrated circuit ("IC") includes one or more semiconductor devices. One way in which to represent a semiconductor device is with a plan view diagram referred to as a layout diagram.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2E and 2F are layout diagrams of corresponding cell regions, in accordance with some embodiments.

FIGS. 2B, 2C and 2D are corresponding cross-sections of the layout diagram of FIG. 2A, in accordance with some embodiments.

FIGS. 3A, 3B and 3C are layout diagrams of corresponding cell regions, in accordance with some embodiments.

FIGS. 3D and 3E are corresponding cross-sections of the layout diagrams of corresponding FIGS. 3A and 3C, in accordance with some embodiments.

DETAILED DESCRIPTION

Figure 1:
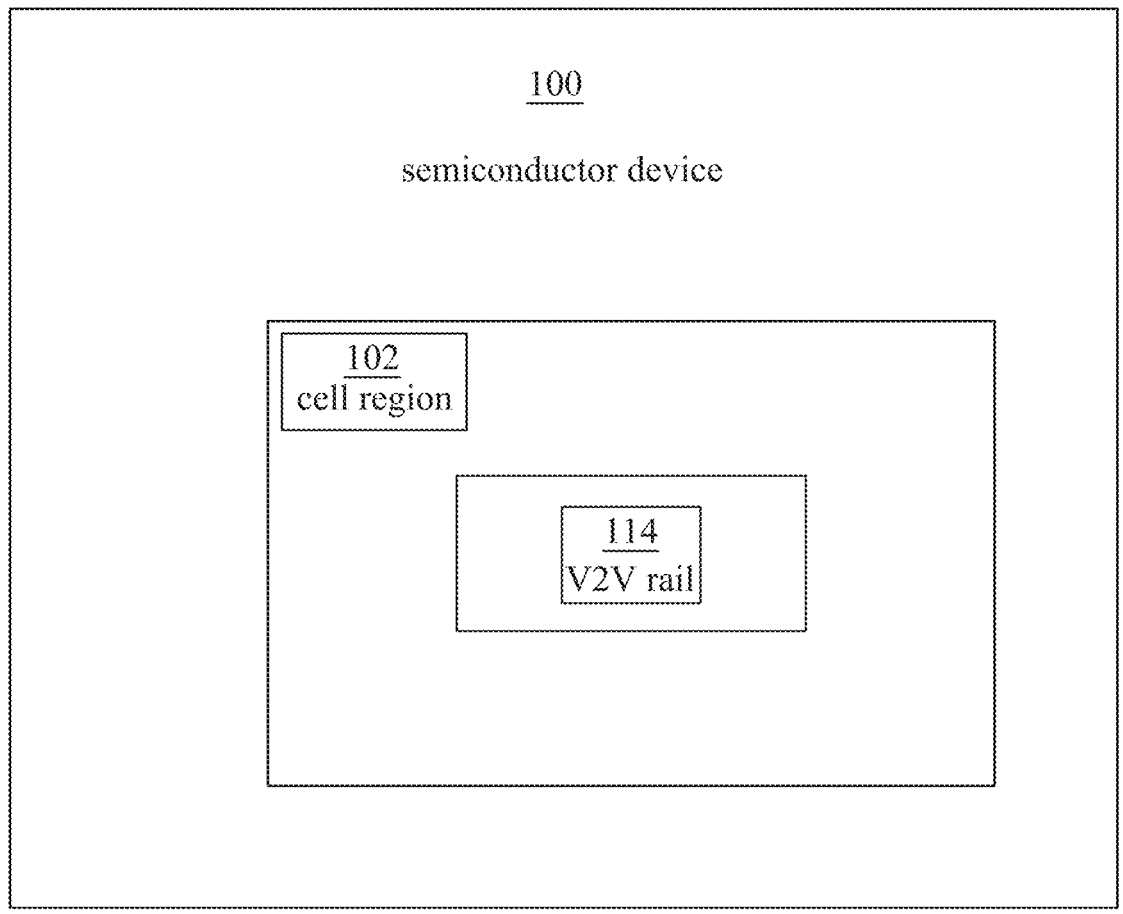
FIG. 1 is a block diagram of a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device has a via-to-via (V2V) rail. In some embodiments, the V2V rail is configured so that a gap is formed between a lower surface of the V2V rail and upper surfaces of corresponding underlying metal-to-source/drain (MD) contact structures. In some embodiments, the gap between the V2V rail and a corresponding underlying MD contact structure is at least partially filled by a via-to-MD (VD) structure between the MD contact structure and a corresponding conductive segment (the latter being in an overlying metallization layer), the VD structure electrically coupling the conductive segment, the MD contact structure and the V2V rail. For example, according to some embodiments, the gap between the V2V rail and a corresponding underlying MD contact structure is filled with a dielectric material which electrically decouples the V2V rail from the MD contact structure. In some embodiments, a semiconductor device includes: a V2V rail that correspondingly overlaps first, second and third MD contact structures, the second MD contact structure being interposed between the first and third MD contact structures; first and second VD structures correspondingly on and electrically coupled to the first and third MD contact structures, the V2V rail being electrically coupled to the first and second VD structures; and a conductive segment in an overlying metallization layer electrically coupled to the first and second VD structures; and wherein the second MD contact structure is electrically decoupled from the V2V rail.

According to another approach, a V2V rail is configured so that (1) a bottom surface of the V2V rail is correspondingly contiguous with an upper surface of each corresponding underlying MD contact structure, i.e., with no gap therebetween, (2) the V2V rail overlaps each of first, second and third underlying MD contact structures, the second MD contact structure being interposed between the first and third MD contact structures, (3) the V2V rail is electrically coupled to the first and third MD contact structures. According to the V2V rail of the other approach, the interposed second MD contact structure necessarily is also coupled to the V2V rail and thus the first and third MD contact structures because the bottom surface of the V2V rail is correspondingly contiguous with an upper surface of each corresponding underlying MD contact structure. However, there are circumstances in which it is desirable for the interposed second MD contact structure to be electrically decoupled from the first and third MD contact structures. By contrast, according to some embodiments, the V2V rail is configured so that a gap is formed between the lower surface of the V2V rail and upper surfaces of corresponding underlying MD contact structures, with a result that an MD contact structure is electrically decoupled from the V2V rail unless a corresponding VD structure is formed on the MD contact structure. Continuing the example, according to some embodiments, in which a second MD contact structure is interposed between first and third MD contact structures, and in which first and second VD structures are formed on the first and third MD contact structures, the interposed second MD contact structure is electrically decoupled from the V2V rail (and thus from the first and third MD contact structures) unless a corresponding VD structure is formed on the second MD contact structure.

FIG. 1 is a block diagram of a semiconductor device 100 in accordance with at least one embodiment of the present disclosure.

In FIG. 1, semiconductor device 100 includes, among other things, a cell region 102. In some embodiments, cell region 102 is an SRAM cell region. In some embodiments, cell region 102 is a cell region other than an SRAM cell region. Cell 102 includes, among other things, a via-to-via (V2V) rail 114 (see FIGS. 2A-2F and 3A-3E). Examples of layout diagrams resulting in a cell region that includes a rail 114 include the layout diagrams in each of each of FIGS. 2A-2F and 3A-3E.

Figures 2E, 2F:
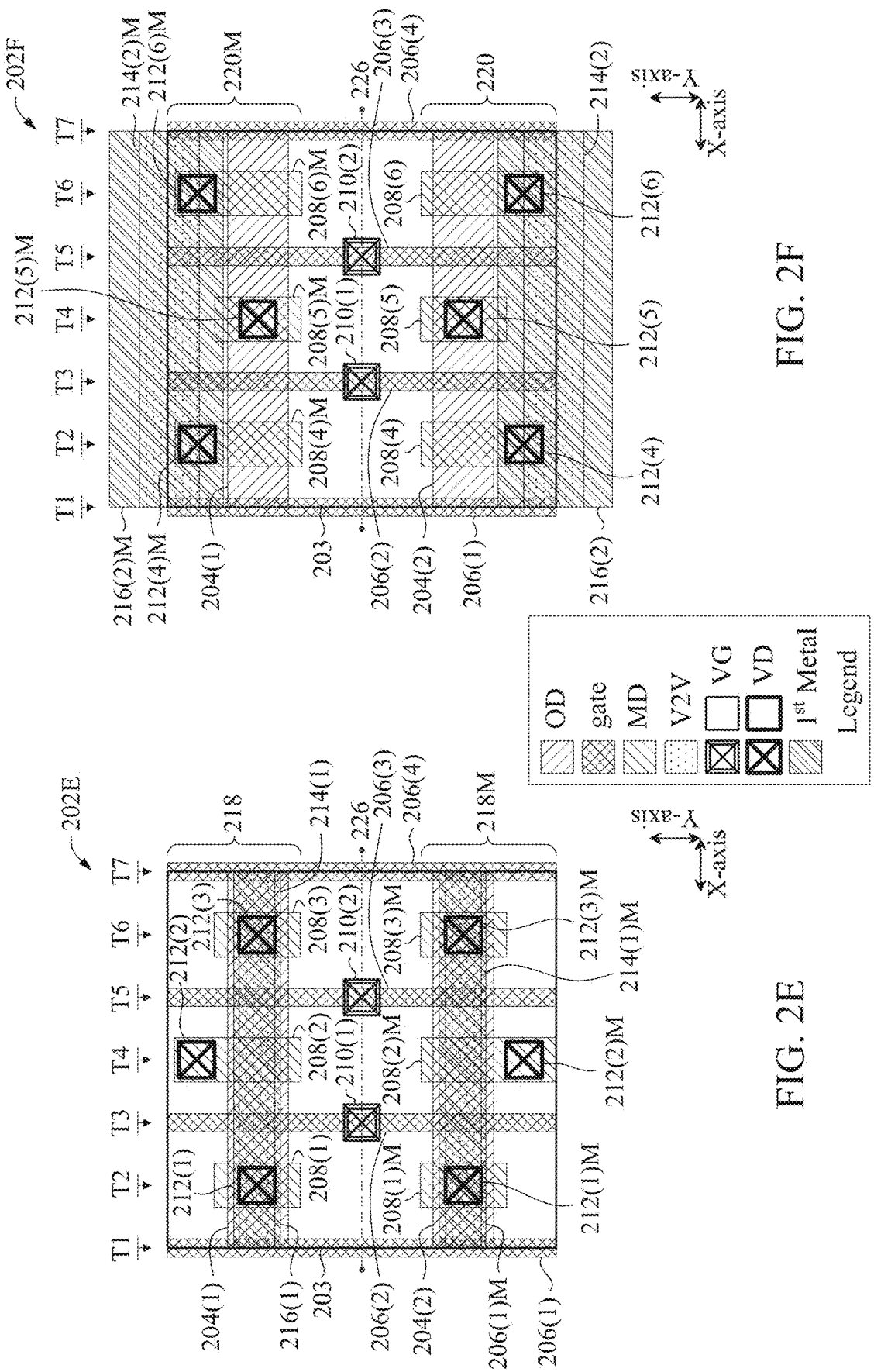

FIGS. 2A, 2E and 2F are layout diagrams of corresponding cell regions 202A, 202E and 202F, in accordance with some embodiments. FIGS. 2B, 2C and 2D are corresponding cross-sections of the layout diagram of FIG. 2A, in accordance with some embodiments.

The layout diagrams of FIGS. 2A and 2E-2F are representative of corresponding cell regions in corresponding semiconductor devices fabricated correspondingly in part according to the layout diagrams of FIGS. 2A and 2E-2F. As such, individual shapes (also known as patterns) in the layout diagrams of FIGS. 2A and 2E-2F are representative of corresponding individual structures in corresponding cell regions of corresponding semiconductor devices fabricated correspondingly in part according to the layout diagrams of FIGS. 2A and 2E-2F.

For simplicity of discussion, elements in the layout diagrams of FIGS. 2A and 2E-2F (and in other layout diagrams included herein) will be referred to as if they are structures rather than shapes per se. For example, each of shapes 204(1) and 204(2) in each of the layout diagrams of FIGS. 2A and 2E-2F is an active area shape which represents an active region in a corresponding semiconductor device. In the following discussion, shapes 204(1) and 204(2) are referred correspondingly as active regions 204(1) and 204(2) rather than as active area patterns 204(1) and 204(2). Also, for example, shapes 214(1) and 214(2) in each of the layout diagrams of FIGS. 2A and 2E-2F is a via-to-via (V2V) rail shape which represents a corresponding V2V rail 114 in a corresponding semiconductor device. In the following discussion, V2V rail shapes 214(1) and 214(2) are referred to correspondingly as V2V rails 214(1) and 214(2) rather than as V2V rail shapes 214(1) and 214(2).

The layout diagrams of FIGS. 2A and 2E-2F correspondingly are organized according to track lines T1, T2, T3, T4 and T5 which are parallel to a first direction. The first direction is in the direction of the Y-axis in FIGS. 2A and 2E-2F. In some embodiments, relative to the X-axis, adjacent track lines are separated by one-half a unit of contacted poly pitch (CPP). Typically, the unit of CPP is specific to a corresponding process node by which will be fabricated a semiconductor device based on a corresponding layout diagram. For example, track lines T3 and T4 are separated by CPP/2, and track lines T3 and T5 are separated by 1*CPP. Relative to the X-axis, each of cell regions 202A, 202E and 202F has a width of 3CPP.

Cross-section lines IIB-IIB' and IIC-IIC' in FIG. 2A correspondingly extend in a second direction perpendicular to the first direction, the second direction being the X-axis in FIGS. 2A and 2E-2F. In some embodiments, the first and second directions are perpendicular directions other than the corresponding directions of the Y-axis and the X-axis. In each of FIGS. 2E-2F, an axis of symmetry 226 extends in the second direction, i.e., in the direction of the X-axis.

In FIG. 2A, cell region 202A includes: active regions 204(1) and 204(2); gate structures 206(1), 206(2), 206(3) and 206(4); wiring-segment to drain/source (WD) contact structures 208(1), 208(2), 208(3), 208(4), 208(5) and 208(6); via-to-gate (VG) structures 210(1) and 210(2); via-to-WD structures 212(1), 212(2), 212(3), 212(4), 212(5) and 212(6); V2V rails 214(1) and 214(2); and conductive segments 216(1) and 216(2) in a first metallization layer. In some embodiments, the WD contact structures are described as metal-to-drain/source (MD) contact structures, and will be referred as such herein. Accordingly, in some embodiments, the via-to-WD structures are described as via-to-MD structures, and will be referred as such herein. In FIG. 2A, a cell boundary 203 is shown, which is a feature of a layout diagram but does not have a corresponding structure in a semiconductor device based on FIG. 2A. In some embodiments, the numbering convention begins at zero, and accordingly the first metallization is M0. In some embodiments, the numbering convention begins at one, and accordingly the first metallization is M1.

In FIG. 2A, active regions 204(1)-204(2) extend in the direction of the X-axis. Gate structures 206(1)-206(4) correspondingly extend in the direction of the Y-axis; and correspondingly are over, and electrically coupled to, corresponding active regions 204(1)-204(2). VG structures 210(1) and 210(2) are over, and electrically coupled to, corresponding gate structures 206(2) and 206(3). In some embodiments, gate structures 206(1) and 206(4) are dummy gate structures.

In FIG. 2A, MD contact structures 208(1)-208(3) correspondingly extend in the direction of the Y-Y-axis; and correspondingly are over, and electrically coupled to, active region 204(1). MD contact structures 208(4)-208(6) are correspondingly over, and electrically coupled to, active region 204(2). VD structures 212(1)-212(3) are correspondingly over, and electrically coupled to, MD contact structures 208(1)-208(3). VD structures 212(4)-212(6) are correspondingly over, and electrically coupled to, MD contact structures 208(4)-208(6).

In FIG. 2A, V2V rail 214(1) extends in the direction of the X-axis; is over active region 204(1); is correspondingly over MD contact structures 208(1) and 208(3); and is correspondingly over, and electrically coupled to, VD structures 212(1) and 212(3). V2V rail 214(2) extends in the direction of the X-axis; and correspondingly is over MD contact structures 208(4) and 208(6); and is correspondingly over, and electrically coupled to, VD structures 212(4) and 212(6). Conductive segment 216(1) extends in the direction of the X-axis; is over active region 204(1); and correspondingly is over MD contact structures 208(1) and 208(3) and V2V rail 214(1). Conductive segment 216(2) extends in the direction of the X-axis; and correspondingly is over MD contact structures 208(4) and 208(6) and V2V rail 214(2). In some embodiments, regarding width as measured relative to the Y-axis, the width of the V2V rail is narrower than the corresponding conductive segment. For example, the widths of V2V rails 214(1) and 214(2) are narrower than corresponding conductive segments 216(1) and 216(2). In some embodiments, relative to layer location as measured relative to the Z-axis, the width of the V2V rail is narrower than the corresponding conductive segment because the V2V rail is in a layer which is a lower than the layer of the corresponding conductive segment. In some embodiments, regarding width measured relative to the Y-axis, the width of the V2V rail is substantially the same as the corresponding conductive segment. In some embodiments, regarding width measured relative to the Y-axis, the width of the V2V rail is wider than the corresponding conductive segment.

In FIG. 2A, active regions 204(1) and 204(2) are corresponding semiconductor regions. In some embodiments, active regions 204(1) and 204(2) are correspondingly doped semiconductor regions. In some embodiments, active region 204(1) is configured for P-type conductivity, e.g., PMOS transistors, and active region 204(2) is configured for N-type conductivity, e.g., NMOS transistors. In some embodiments, active region 204(1) is configured for N-type conductivity, and active region 204(2) is configured for P-type conductivity. In some embodiments, each of active region 204(1) and 204(2) is configured for the same type of conductivity.

Various transistors are represented in FIG. 2A. A first transistor includes gate structure 206(2) and source/drain regions in active region 204(1) which correspondingly underlie MD contact structures 208(1) and 208(2). A second transistor includes gate structure 206(3) and source/drain regions in active region 204(1) which correspondingly underlie MD contact structures 208(2) and 208(3). A third transistor includes gate structure 206(2) and source/drain regions in active region 204(2) which correspondingly underlie MD contact structures 208(4) and 208(5). A fourth transistor includes gate structure 206(3) and source/drain regions in active region 204(2) which correspondingly underlie MD contact structures 208(5) and 208(6).

In FIG. 2A, in some embodiments, cell region 202A represents the basis of a four transistor (4T) inverter. In some embodiments, an inverter is regarded as an example of a Boolean logic function. In some embodiments, cell region 202A is included in a larger cell region which represents other Boolean logic functions, e.g., AND, OR, XOR, XNOR, or the like. In some embodiments, cell region 202A is included in a larger cell region which represents a storage function, e.g., a flip-flop, latch, or the like. More particularly, in such embodiments: conductive segments 216(1) and 216(2) are correspondingly electrically coupled to first and second reference voltages, e.g., to VDD and VSS; MD contacts 208(2) and 208(5) are extended in the direction of the Y-axis to merge with each other (not shown) and be electrically coupled together and serve as an output pin of the inverter; and an additional conductive segment (not shown) is provided in the first metallization layer, the additional conductive segment electrically coupling VG structures 210(1)-210(2) and serving as in input pin of the inverter.

In FIG. 2A, cell region 202A has a heterogeneous arrangement of power rail (PR) architectures. In some embodiments, cell region 202A is described as being PR-heterogeneous. The upper portion of cell region 202A has a private PR (PPR) architecture 218, as explained below.

The lower portion of cell region 202A has a common PR (CPR) architecture 220, as explained below.

In some embodiments, the common aspect of CPR architecture is understood as follows. In the lower portion of cell region 202A, relative to the Y-axis, the power rail (e.g., conductive segment 216(2)) overlaps a bottom edge of the cell boundary 203. Another cell region (not shown) which abuts the bottom edge of cell boundary 203 would share the power rail with cell region 202A. Because the power rail of the lower portion of cell region 202A extends across the bottom edge of cell boundary 203 and is able to be shared (i.e., is shareable) with another cell region, the power rail is regarded as being a common power rail.

In some embodiments, the private aspect of PPR architecture is understood as follows. In the upper portion of cell region 202A, relative to the Y-axis, the power rail (e.g., conductive segment 216(1)) does not overlap the top edge of cell boundary 203. Another cell region (not shown) which abuts the top edge of cell boundary 203 would not be able to share the power rail with cell region 202A. Because the power rail of the upper portion of cell region 202A does not extend across the top edge of cell boundary 203, i.e., because the power rail in the upper portion of cell region 202A and is not shareable, the power rail is regarded as being a private power rail.

According to PPR architecture 218, each of V2V rail 214(1) and conductive segment 216(1) in FIG. 2A overlaps active region 204(1). More particularly, relative to the Y-axis, each of V2V rail 214(1) and conductive segment 216(1) is centered over active region 204(1). Also, relative to the Y-axis, neither V2V rail 214(1) nor conductive segment 214 extends across a top edge of cell boundary 203.

In FIG. 2A, in terms of length relative to the Y-axis, the length of longer MD contact structure 208(2) is sufficient so that a substantial portion of MD contact structure 208(5) is not overlapped by either of V2V rail 214(1) or conductive segment 216(1). Recalling that VD structure 212(2) corresponds to MD contact structure 208(2), the length of longer MD contact structure 208(2) results in VD structure 212(2) not being overlapped by V2V rail 214(1), i.e., results in VD structure 212(2) being electrically decoupled from V2V rail 214(1).

By contrast, relative to the Y-axis, the length of each of shorter MD contact structures 208(1) or 208(3) results in each of MD contact structures 208(1) or 208(3) correspondingly being overlapped by each of V2V rail 214(1) and conductive segment 216(1). Recalling that VD structures 212(1) and 212(3) correspond to MD contact structures 208(1) and 208(3), the length of each of shorter MD contact structures 208(1) and 208(3) further results in VD structures 212(1) and 212(3) being overlapped by V2V rail 214(1), i.e., further results in VD structures 212(1) and 212(3) being electrically coupled to V2V rail 214(1).

In FIG. 2A, according to CPR architecture 220, and relative to the Y-axis, each of V2V rail 214(2) and conductive segment 216(2) in FIG. 2A overlaps a bottom edge of cell boundary 203. More particularly, relative to the Y-axis, each of V2V rail 214(2) and conductive segment 216(2) is centered the bottom edge of cell boundary 203. Also, relative to the Y-axis, neither V2V rail 214(1) nor conductive segment 214 overlaps active region 204(2).

Relative to the Y-axis, the length of shorter MD contact structure 208(5) results in MD contact structure 208(5) not being overlapped by V2V rail 214(2), and not being overlapped by conductive segment 216(2). Recalling that VD structure 212(5) corresponds to MD contact structure 208(5), the length of shorter MD contact structure 208(5) further results in VD structure 212(5) not being overlapped by V2V rail 214(2), i.e., further results in VD structure 212(5) being electrically decoupled from V2V rail 214(2).

By contrast, in terms of length relative to the Y-axis, the length of each of longer MD contact structures 208(4) or 208(6) is sufficient so that each of MD contact structures 208(4) or 208(6) correspondingly is overlapped by each of V2V rail 214(2) and conductive segment 216(2). Recalling that VD structures 212(4) and 212(6) correspond to MD contact structures 208(4) and 208(6), the longer length of each of longer MD contact structures 208(4) and 208(6) further results in VD structures 212(4) and 212(6) being overlapped by V2V rail 214(2), i.e., further results in VD structures 212(4) and 212(6) being electrically coupled to V2V rail 214(2).

In some embodiments, the PPR architecture is varied. In some embodiments, regarding the PPR architecture, a longer MD contact structure is swapped in position (relative to the X-axis) with a shorter MD contact structure, and corresponding VD structures are moved accordingly. As an example of position-swapping, regarding PPR architecture 218, instead of being aligned with track T4, longer MD contact structure 208(2) is aligned (not shown) with track T6, and shorter MD contact structure 208(3) is correspondingly aligned (not shown) with track T4. As another example of position-swapping, instead of being aligned with track T4, longer MD contact structure 208(2) is aligned (not shown) with track T2, and shorter MD contact structure 208(1) is correspondingly aligned (not shown) with track T4.

In some embodiments, regarding the PPR architecture, a shorter MD contact structure is replaced with a longer MD contact structure (length-replacement), and the corresponding VD structure is moved accordingly, resulting in two shorter and one longer MD contact structures. As an example of length-replacement, regarding PPR architecture 218M, shorter MD contact 208(3)M is replaced (not shown) with a longer MD contact structure (not shown but similar to MD contact structure 208(2)M). As another example of length-replacement, shorter MD contact 208(1)M is replaced (not shown) with a longer MD contact structure (not shown but similar to MD contact structure 208(2)M).

In some embodiments, the CPR architecture is varied. In some embodiments, regarding the CPR architecture, a shorter MD contact structure is swapped in position (relative to the X-axis) with a longer MD contact structure, and corresponding VD structures are moved accordingly. As an example of position-swapping, regarding CPR architecture 220, instead of being aligned with track T4, shorter MD contact structure 208(5) is aligned (not shown) with track T6, and longer MD contact structure 208(6) is correspondingly aligned (not shown) with track T4. As another example of position-swapping, instead of being aligned with track T4, shorter MD contact structure 208(5) is aligned (not shown) with track T2, and longer MD contact structure 208(4) is correspondingly aligned (not shown) with track T4.

In some embodiments, regarding the CPR architecture, a longer MD contact structure is replaced (not shown) with a shorter MD contact structure (length-replacement), and the corresponding VD structure is moved accordingly, resulting in two shorter and one longer MD contact structures. As an example of length-replacement, regarding CPR architecture 220M, longer MD contact 208(6)M is replaced (not shown) with a shorter MD contact structure (not shown but similar to MD contact structure 208(5)M). As another example of length-replacement, longer MD contact 208(4)M is replaced with a shorter MD contact structure (not shown but similar to MD contact structure 208(5)M).

Again, FIGS. 2B, 2C and 2D are corresponding cross-sections of the layout diagram of FIG. 2A, in accordance with some embodiments.

Cross-section line IIB-IIB' in FIG. 2A shows how FIG. 2B relates to corresponding FIGS. 2A and 2B. Cross-section line IIC-IIC' in FIG. 2A shows how FIG. 2D relates to FIG. 2A.

In each of FIGS. 2B-2C, V2V rail 214(1) is configured with a thickness that results in gaps 222(1), 222(2) and 222(3) being formed between a lower surface of V2V rail 214(1) and upper surfaces of corresponding MD contact structures 208(1), 208(2) and 208(3). Portions of VD structures 212(1) and 212(3) fill corresponding gaps 222(1) and 222(3). A dielectric material (not shown) fills gap 222(2) such that MD contact structure 208(2) is electrically decoupled from V2V rail 214(1). According to another approach, a V2V rail is configured so that (1) a bottom surface of the V2V rail is correspondingly contiguous with an upper surface of each corresponding underlying MD contact structure. As such, if V2V rail 214(2) was to be replaced with the V2V rail according to the other approach, then MD contact structure would be electrically coupled to MD contact structure 208(2), and thus electrically coupled also to each of MD contact structure 208(1) and 208(3), with a result that the first transistor (corresponding to gate structure 206(2) and source/drain regions in active region 204(1) which correspondingly underlie MD contact structures 208(1) and 208(2)) would no longer be a transistor capable of functioning as a switch. By contrast, in FIG. 2A, V2V rail 214(1) is configured advantageously so that gaps 222(1), 222(2) and 222(3) are formed between the lower surface of V2V rail 214(1) and upper surfaces of MD contact structures 208(1), 208(2) and 208(3), with a result that an MD contact structure 208(2) is electrically decoupled from V2V rail 214(1).

In FIG. 2D, relative to the Z-axis, V2V rail 214(2) is configured with a thickness that results in gaps 222(4), 222(5) and 222(6) being formed between a lower surface of V2V rail 214(2) and upper surfaces of corresponding MD contact structure 208(4), MD contact structure-ghost 208(5)' (see below) and MD contact structure 208(6). Relative to the Y-axis, MD contact structure 208(5) does not underlap V2V rail 214(2). Accordingly, a phantom line, i.e., a broken line version of MD contact structure 208(5)', is shown where MD contact structure 208(5) otherwise would be in FIG. 2D. Relative to the Z-axis, each of gaps 222(1)-222(6) has a size/distance shown as item 223 in FIGS. 2A-2C.

In FIGS. 2A and 2D, relative to the Z-direction, V2V rail 214(1) is configured so that an upper surface of V2V rail 214(1) does not project beyond upper surfaces of corresponding VD structures 212(1) and 212(3). V2V rail 214(2) is configured so that an upper surface of V2V rail 214(2) does not project beyond upper surfaces of corresponding VD structures 212(4) and 212(6).

FIG. 2C is a variation of FIG. 2B, in accordance with some embodiments. More particularly, FIG. 2C shows a small portion of the variation of FIG. 2B. In FIG. 2C, V2V rail 214(2)' is configured so that a gap, e.g., 224(1), is formed between an upper surface of V2V rail 214(1) and a lower surface of conductive segment 216(1).

FIG. 2E is a variation of FIG. 2A. FIG. 2F is a variation of FIG. 2A. More particularly, cell region 208E is a variation of cell region 208A. More particularly, cell region 208F is a variation of cell region 208A.

In FIG. 2E, relative to the Y-axis, cell region 208E is bisected by a line 226 that extends in the direction of the X-axis. In FIG. 2F, relative to the Y-axis, cell region 208F is bisected by line 226 that extends in the direction of the X-axis. Line 226 is an axis of mirror symmetry.

In FIG. 2E, cell region 202E has a homogeneous arrangement of PPR architectures. In some embodiments, cell region 202E is described as being PPR-homogeneous, i.e., cell region 202E does not include CPR architecture. The upper portion of cell region 202E has PPR architecture 218. The lower portion of cell region 202E has PPR architecture 218M. Relative to axis 226, the letter M suffix in item number 218M indicates that PPR architecture 218M is mirror symmetric with respect to PPR architecture 218. Thus, cell region 202E has a PPR-homogeneous architecture.

As compared to the PR-heterogeneous architecture of cell region 202A, the PPR-homogeneous architecture of cell region 202E includes the following mirror symmetric components: MD contact structures 208(1)M, 208(2)M and 208(3)M correspondingly instead of MD contact structures 208(4), 208(5) and 208(6); and VD structures 212(1)M, 212(2)M and 212(3)M correspondingly instead of VD structures 212(4), 212(5) and 212(6). In some embodiments, the PPR architecture is varied resulting in a cell region that is PPR-homogeneous but is not mirror-symmetric with respect to axis 226.

In FIG. 2F, cell region 202F has a homogeneous arrangement of CPR architectures. In some embodiments, cell region 202F is described as being CPR-homogeneous, i.e., cell region 202F does not include PPR architecture. The upper portion of cell region 202F has CPR architecture 220M. The lower portion of cell region 202F has CPR architecture 220. Relative to axis 226, the letter M suffix in item number 220M indicates that CPR architecture 220M is mirror symmetric with respect to CPR architecture 220. Thus, cell region 202F has a CPR-homogeneous architecture.

As compared to the PR-heterogeneous architecture of cell region 202A, the CPR-homogeneous architecture of cell region 202F includes the following mirror symmetric components: MD contact structures 208(4)M, 208(5)M and 208(6)M correspondingly instead of MD contact structures 208(1), 208(2) and 208(3); and VD structures 212(4)M, 212(5)M and 212(6)M correspondingly instead of VD structures 212(1), 212(2) and 212(3). In some embodiments, the CPR architecture is varied resulting in a cell region that is CPR-homogeneous but is not mirror-symmetric with respect to axis 226.

FIGS. 3A, 3B and 3C are layout diagrams of corresponding cell regions 302A, 302B and 302C, in accordance with some embodiments. FIGS. 3D and 3E are corresponding cross-sections of the layout diagrams of corresponding FIGS. 3A and 3C, in accordance with some embodiments.

The layout diagrams of FIGS. 3A-3C are representative of corresponding cell regions in corresponding semiconductor devices fabricated correspondingly in part according to the layout diagrams of FIGS. 3A-3C. As such, individual shapes (also known as patterns) in the layout diagrams of FIGS. 3A-3C are representative of corresponding individual structures in corresponding cell regions of corresponding semiconductor devices fabricated correspondingly in part according to the layout diagrams of FIGS. 3A-3C. For simplicity of discussion, elements in the layout diagrams of FIGS. 3A-3C (and in other layout diagrams included herein) will be referred to as if they are structures rather than shapes per se.

FIGS. 3A-3E follow a similar numbering scheme to that of FIGS. 2A-2F. Though corresponding, some components also differ. To help identify components which correspond but nevertheless have differences, the numbering convention uses 3-series numbers for FIGS. 3A-3E while the numbering convention for FIGS. 2A-2F uses 2-series numbers. For example, item 204(1) of FIG. 2A is an active region and corresponding item 304(1) in FIG. 3A is an active region, and wherein: similarities are reflected in the common root *04(1); and differences are reflected in the leading digit 3 used for FIG. 3A and the leading digit 2 used for FIG. 2F. For brevity, the discussion will focus more on differences between FIGS. 3A-3C and FIGS. 2A-2E than on similarities.

Layout diagrams 302A-302C correspondingly are organized according to track lines T1, T2, T3, T4 and T5. Cross-section line IIID-IIID' in cross-section line IIIE-IIIE' in FIG. 3C correspondingly extend in a second direction perpendicular to the first direction. The second direction is, e.g., the X-axis in FIGS. 3A-3C.

In FIG. 3A, cell region 302A includes: active regions 304(1) and 304(2); gate structures 306(1), 306(2), 306(3) and 306(4); MD contact structures 308(1) and 308(2); VG structures 310(1) and 310(2); VD structures 312(1) and 312(2); V2V rail 314(1); and conductive segments 316(1), 316(2) and 316(3) in a first metallization layer. In FIG. 3A, a cell boundary 303 is shown, which is a feature of a layout diagram but does not have a corresponding structure in a semiconductor device based on FIG. 3A.

VG structures 310(1) and 310(2) are over, and electrically coupled to, gate structure 306(2). MD contact structures 308(1)-308(2) correspondingly extend in the direction of the Y-axis; and correspondingly are over, and electrically coupled to, active regions 304(1) and 304(2). VD structures 312(1)-312(2) are correspondingly over, and electrically coupled to, MD contact structure 308(2). V2V rail 314(1) extends in the direction of the X-axis; correspondingly is over MD contact structures 308(1) and 308(2); and is correspondingly over, and electrically coupled to, VD structures 312(1)-312(2).

In FIG. 3A, conductive segments 316(1)-316(3) extend in the direction of the X-axis. Conductive segments 316(1) and 316(3) correspondingly are over, and electrically coupled to, VG structures 310(1) and 310(2). In some embodiments, gate structures 206(1) and 206(3) are dummy gate structures. Conductive segment 316(2) correspondingly is over MD contact structures 308(1) and 308(3) and V2V rail 314(1); and is over, and electrically coupled to, VD structures 312(1) and 312(2). The architecture of cell region 302A is PPR-homogeneous.

An axis of mirror symmetry 326 extends in the direction of the X-axis. Relative to the Y-axis, V2V rail 314(1) and conductive segment 316(1) are: between active regions 304(1) and 304(2); and centered on axis 326.

In some embodiments in which rows extend in the direction of the X-axis, and in which the height of a cell region is relative to Y-axis, the double height cell region has a height of two rows and a single height cell has height of one row. Cell region 302A is a double height cell region, whereas, e.g., cell region 102A is a single height cell region. As cell region 302 is a double height cell region, in some embodiments, axis 326 also represents a boundary between two rows.

MD contact structure 308(1) electrically couples drain/source (DS) region 328(1) of active region 304(1) to DS region 328(3) of active region 304(2). MD contact structure 308(2) electrically couples DS region 328(2) of active region 304(1) to DS region 328(4) of active region 304(2). Relative to the X-axis, cell region 302A has a width of 2 CPP.

According to some other embodiments (not shown), the interconnections of cell region 302A are provided by a single height cell region in which first and second DS regions corresponding to DS regions 308(1) and 308(3) are in the same active region, and third and fourth DS regions corresponding to DS regions 308(2) and 308(4) are in the same active region. Relative to the X-axis, the single height cell region according to the other embodiments has a width of 3 CPP. The single height cell region according to the other embodiments uses: a first additional conductive segment in the first metallization layer (and corresponding VD structures) to electrically couple the first and second DS regions; and a second additional conductive segment in the first metallization layer (and corresponding VD structures) to electrically couple the third and fourth DS regions. By electrically (1) coupling DS regions 328(1) and 328(3) using MD contact structure 308(1), and (2) DS regions 328(2) and 328(4) using MD contact structure 308(2), cell region 302A has: advantages including reducing congestion in the first metallization layer while narrowing the width of the cell region, as compared to the cell region of the other embodiments; and a disadvantage of increasing the height of the cell region as compared to the cell region of the other embodiments. In some embodiments, the advantages of cell region 302A are regarded as outweighing the noted disadvantage of cell region 302A.

FIG. 3B is layout diagram of a cell region 302B that is a variation cell region 202A of FIG. 3A, in accordance with some embodiments.

More particularly, FIG. 3B shows a small portion of cell region 302B in which is variation is located the variation with respect to cell region 302A of FIG. 3A. VD structures 312(1) and 312(2) of FIG. 3A are merged into a single VD structure 312(3) in FIG. 3B. Whereas each of VD structures 312(1) and 312(2) of FIG. 3A is square, VD structure 312(3) is rectangular with a long axis extending in the direction of the Y-axis. In some embodiments, via structure 312(3) is described as a via bar structure.

FIG. 3C is similar to FIG. 3A. For brevity, the discussion will focus more on differences between FIG. 3C and FIG. 3A than on similarities.

Whereas the architecture of cell region 302A is PPR-homogeneous, the architecture of cell region 302C is CPR-homogeneous.

Cell region 302C includes two V2V rails, namely 314(2) and 314(3), rather than a single V2V rail 314(1) as in cell region 302A. Accordingly, VD structures 312(3) and 312(4) of cell region 302C correspondingly replace VD structures 312(1) and 312(2) of cell region 302A.

Relative to the Y-axis: V2V rail 314(2) and conductive segment 316(2) are centered on active region 304(1); and V2V rail 314(3) and conductive segment 316(3) are centered on active region 304(2). In terms of routing congestion in the first metallization layer, and as compared to cell region 302A, cell region 302C: reduces routing congestion between active regions 304(1) and 304(2) because conductive segment 316(1) of FIG. 3A is replaced with conductive segments 316(2) and 316(3) in FIG. 3C; and increases routing congestion over active regions 304(1) and 304(2) because conductive segments 316(2) and 316(3) in FIG. 3C replace conductive segment 316(1) of FIG. 3A.

Again, FIGS. 3D and 3E are corresponding cross-sections of the layout diagram of corresponding FIGS. 3A and 3C, in accordance with some embodiments.

In some embodiments, V2V rail 314(1) is configured so that a gap (not shown but see 224(1) of FIG. 3C) is formed between an upper surface of V2V rail 314(1) and a lower surface of conductive segment 316(2).

Figure 4:
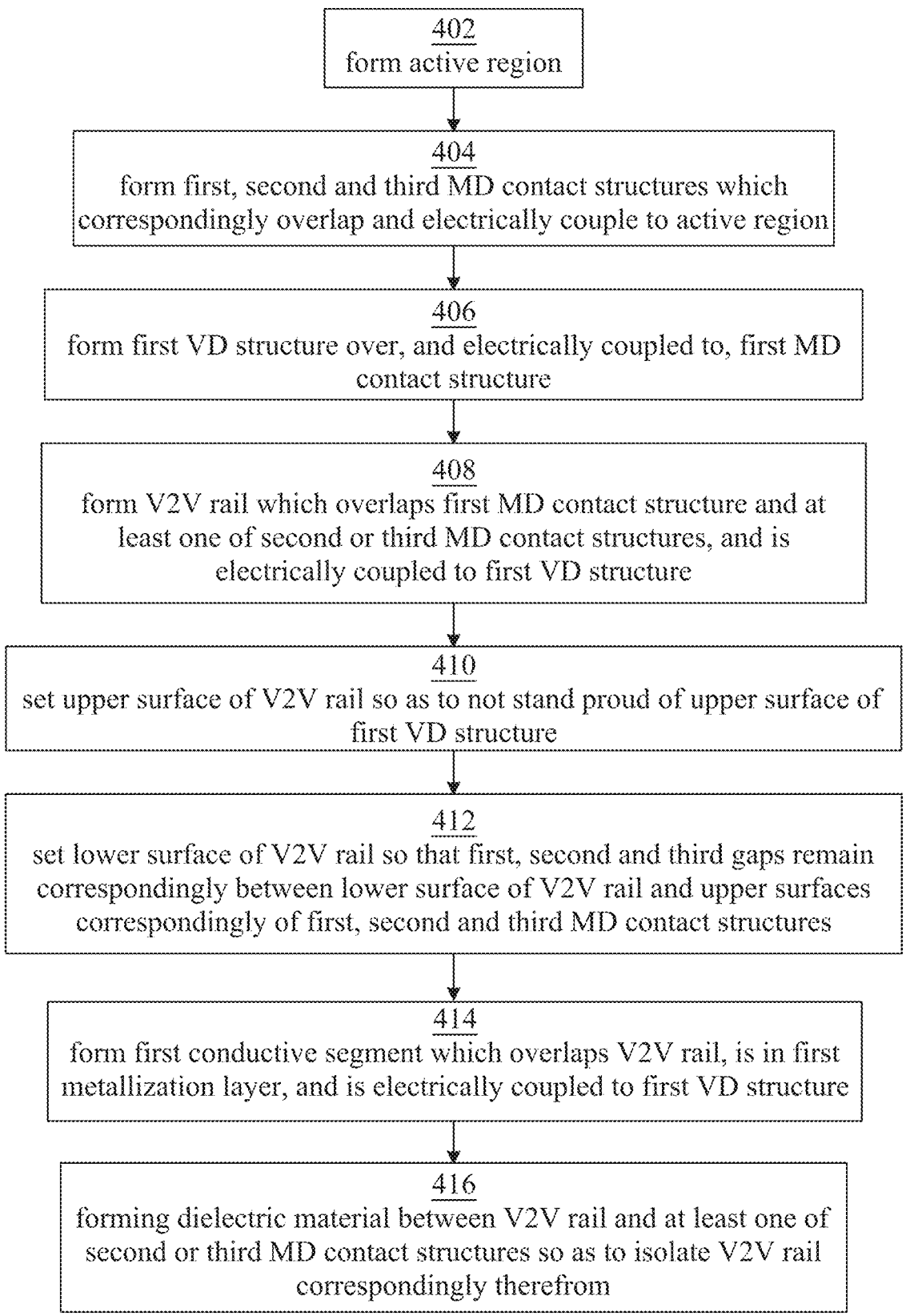
FIG. 4 is a flowchart of a method of fabricating a semiconductor device, in accordance with some embodiments.

FIG. 4 is a flowchart of a method of fabricating a semiconductor device, in accordance with some embodiments.

In FIG. 4, the flowchart includes blocks 402-416. At block 402, an active region is formed. An example of an active region is active region 204(1) of FIG. 2A, or the like. From block 402, flow proceeds to block 404.

At block 404, first, second and third MD contact structures are formed which extend in a first direction, and correspondingly overlap and electrically couple to the active region. An example of the first direction is a direction parallel to the Y-axis. Examples of such first, second and third MD contact structures include MD contact structures 208(1), 208(2) and 208(3) of FIG. 2A, or the like. From block 404, flow proceeds to block 406.

At block 406, a first via-to-MD (VD) structure is formed over, and electrically coupled to, the first MD contact structure. An example of such a first VD structure is VD structure 212(1) of FIG. 2A, or the like. From block 406, flow proceeds to block 408.

At block 408, a via-to-via (V2V) rail is formed which extends in a second direction perpendicular to the first direction so as to overlap the first MD contact structure and at least one of the second or third MD contact structures, and is electrically coupled to the first VD structure. An example of the second direction is a direction parallel to the X-axis. An example of such a V2V rail is V2V rail 214(1) of FIG. 2A, or the like. From block 408, flow proceeds to block 410.

At block 410, relative to a third direction which is perpendicular to each of the first and second directions, an upper surface of the V2V rail is set so as to not project beyond an upper surface of the first VD structure. An example of the third direction is a direction parallel to the Z-axis. An example of such an upper surface of the V2V rail is the upper surface of V2V rail 214(1) in FIG. 2B, or the like. From block 410, flow proceeds to block 412.

At block 412, relative to the third direction, a lower surface of the V2V rail is set so that first, second and third gaps remain correspondingly between the lower surface of the V2V rail and upper surfaces correspondingly of the first, second and third MD contact structures. An example of such a lower surface of the V2V rail is the lower surface of V2V rail 214(1) in FIG. 2B which results in gaps 222(1), 222(2) and 222(3) between the lower surface of V2V rail 214(1) and upper surfaces of corresponding MD contact structures 208(1), 208(2) and 208(3), of the like. From block 412, flow proceeds to block 414.

At block 414, a first conductive segment is formed which overlaps the V2V rail, is in a first metallization layer, and is electrically coupled to the first VD structure. An example of such a first conductive segment is conductive segment 216(1) in FIG. 2A, or the like. From block 414, flow proceeds to block 416.

At block 416, relative to the third direction, a dielectric material is formed between the V2V rail and at least one of the second or third MD contact structures, with a result that the dielectric material electrically isolates the V2V rail correspondingly from the second or third MD contact structure, i.e. the dielectric material electrically decouples the second or third MD contact structure from the V2V rail. An example of a gap (between the V2V rail and at least one of the second or third MD contact structures) that is filled with dielectric material which isolates the V2V rail correspondingly from the second or third MD contact structures, i.e., which electrically decouples the second or third MD contact structure from the V2V rail, is gap 222(2) of FIG. 2B.

In the flowchart of FIG. 4, the VD structures are formed (in general) before the V2V rails. Alternatively, the VD structures are formed (in general) after the V2V rails (see FIG. 5).

Figure 5:
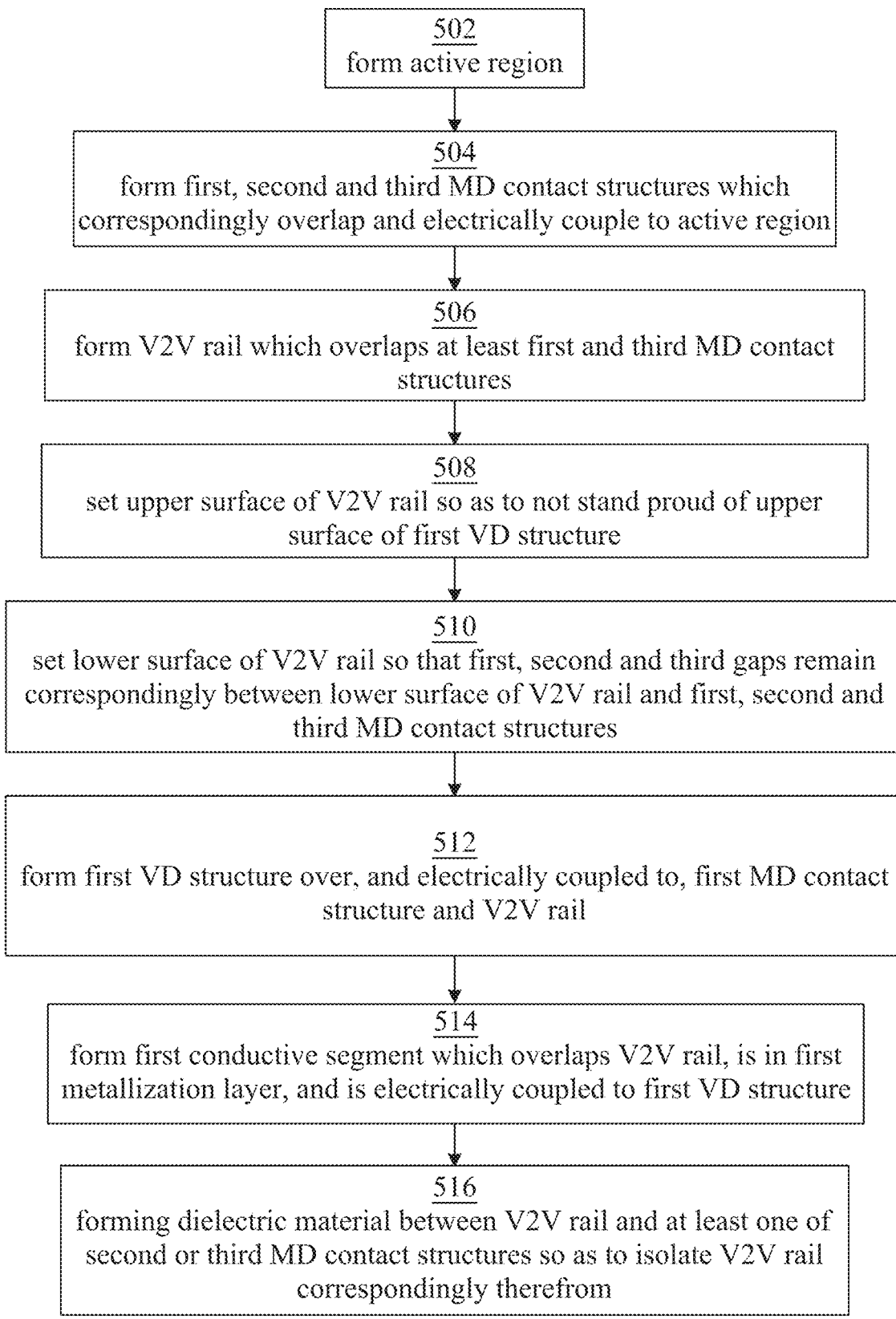
FIG. 5 is a flowchart of a method of fabricating a semiconductor device, in accordance with some embodiments.

FIG. 5 is a flowchart of a method of fabricating a semiconductor device, in accordance with some embodiments.

In FIG. 5, the flowchart includes blocks 502-516. At block 502, an active region is formed. An example of an active region is active region 204(1) of FIG. 2A, or the like. From block 502, flow proceeds to block 504.

At block 504, first, second and third MD contact structures are formed which extend in a first direction, and correspondingly overlap and electrically couple to the active region. An example of the first direction is a direction parallel to the Y-axis. Examples of such first, second and third MD contact structures include MD contact structures 208(1), 208(2) and 208(3) of FIG. 2A, or the like. From block 504, flow proceeds to block 506.

At block 506, a via-to-via (V2V) rail is formed which extends in a second direction perpendicular to the first direction so as to overlap the first MD contact structure and at least one of the second or third MD contact structures, and is electrically coupled to the first VD structure. An example of the second direction is a direction parallel to the X-axis. An example of such a V2V rail is V2V rail 214(1) of FIG. 2A, or the like. From block 506, flow proceeds to block 508.

At block 508, relative to a third direction which is perpendicular to each of the first and second directions, an upper surface of the V2V rail is set so as to not project beyond an upper surface of a first via-to-MD (VD) structure (regarding the latter, see block 512). An example of the third direction is a direction parallel to the Z-axis. An example of such an upper surface of the V2V rail is the upper surface of V2V rail 214(1) in FIG. 2B, or the like. From block 508, flow proceeds to block 510.

At block 510, relative to the third direction, a lower surface of the V2V rail is set so that first, second and third gaps remain correspondingly between the lower surface of the V2V rail and upper surfaces correspondingly of the first, second and third MD contact structures. An example of such a lower surface of the V2V rail is the lower surface of V2V rail 214(1) in FIG. 2B which results in gaps 222(1), 222(2) and 222(3) between the lower surface of V2V rail 214(1) and upper surfaces of corresponding MD contact structures 208(1), 208(2) and 208(3), of the like. From block 510, flow proceeds to block 512.

At block 512, the first VD structure is formed over, and electrically coupled to, the first MD contact structure. An example of such a first VD structure is VD structure 212(1) of FIG. 2A, or the like. From block 512, flow proceeds to block 514.

At block 514, a first conductive segment is formed which overlaps the V2V rail, is in a first metallization layer, and is electrically coupled to the first VD structure. An example of such a first conductive segment is conductive segment 216(1) in FIG. 2A, or the like. From block 514, flow proceeds to block 516.

At block 516, relative to the third direction, a dielectric material is formed between the V2V rail and at least one of the second or third MD contact structures, with a result that the dielectric material electrically isolates the V2V rail correspondingly from the second or third MD contact structure, i.e. the dielectric material electrically decouples the second or third MD contact structure from the V2V rail. An example of a gap (between the V2V rail and at least one of the second or third MD contact structures) that is filled with dielectric material which isolates the V2V rail correspondingly from the second or third MD contact structures, i.e., which electrically decouples the second or third MD contact structure from the V2V rail, is gap 222(2) of FIG. 2B.

Figure 6:
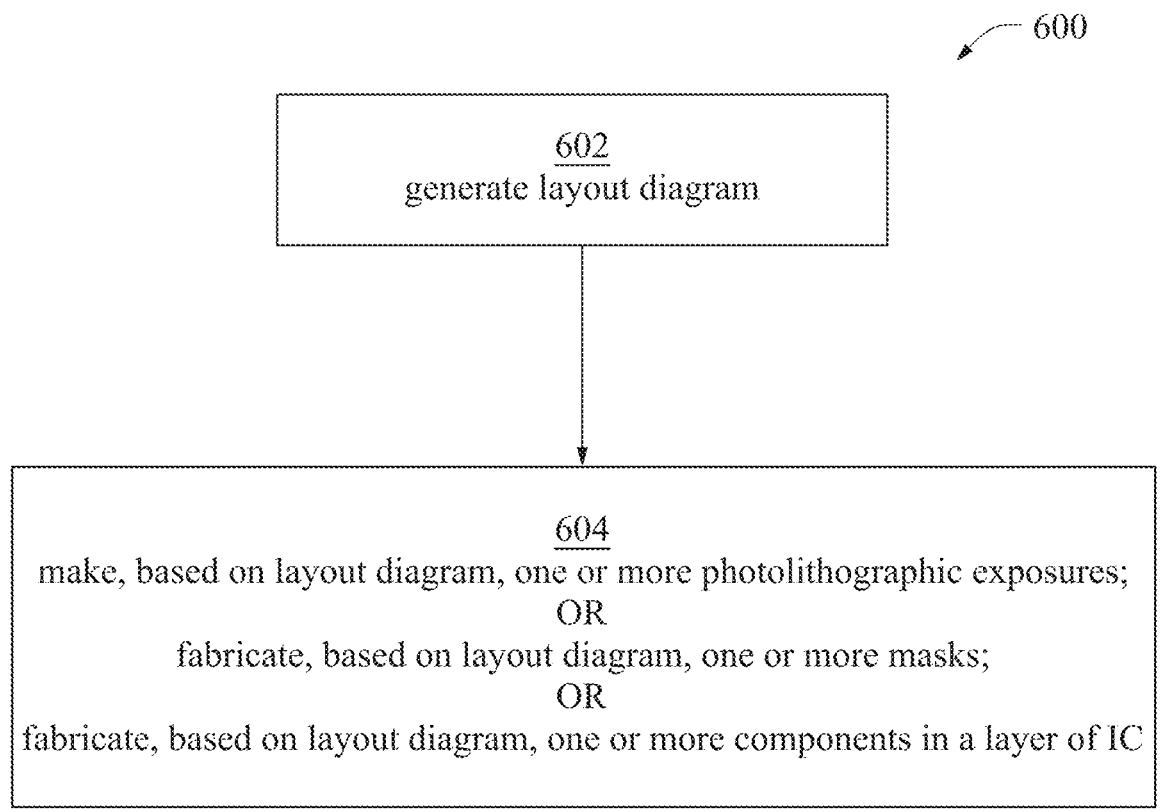
FIG. 6 is a flowchart of a method of manufacturing a semiconductor device, in accordance with some embodiments.

FIG. 6 is a flowchart of a method 600 of manufacturing a semiconductor device, in accordance with some embodiments.

Method 600 is implementable, for example, using EDA system 700 (FIG. 7, discussed below) and an integrated circuit (IC), manufacturing system 800 (FIG. 8, discussed below), in accordance with some embodiments. Examples of a semiconductor device which can be manufactured according to method 600 include semiconductor device 100 of FIG. 1, semiconductor devices corresponding to various ones of the layout diagrams disclosed herein, or the like.

In FIG. 6, method 600 includes blocks 602-804. At block 602, a layout diagram is generated which, among other things, includes one or more of layout diagrams disclosed herein, or the like. Block 602 is implementable, for example, using EDA system 700 (FIG. 7, discussed below), in accordance with some embodiments.

More particularly, block 602 includes generating shapes corresponding to structures in a semiconductor diagram which are to be represented. For example, regarding at block 602: where the layout diagram being generated corresponds to cell region 202A, block 602 includes generating shapes corresponding to the structures shown in cell region 202A; where the layout diagram being generated corresponds to cell region 202E, block 602 includes generating shapes corresponding to the structures shown in cell region 202E; where the layout diagram being generated corresponds to cell region 202F, block 602 includes generating shapes corresponding to the structures shown in cell region 202F; where the layout diagram being generated corresponds to cell region 302A, block 602 includes generating shapes corresponding to the structures shown in cell region 302A; where the layout diagram being generated corresponds to cell region 302B, block 602 includes generating shapes corresponding to the structures shown in cell region 302B; where the layout diagram being generated corresponds to cell region 302C, block 602 includes generating shapes corresponding to the structures shown in cell region 302C; or the like. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 7:
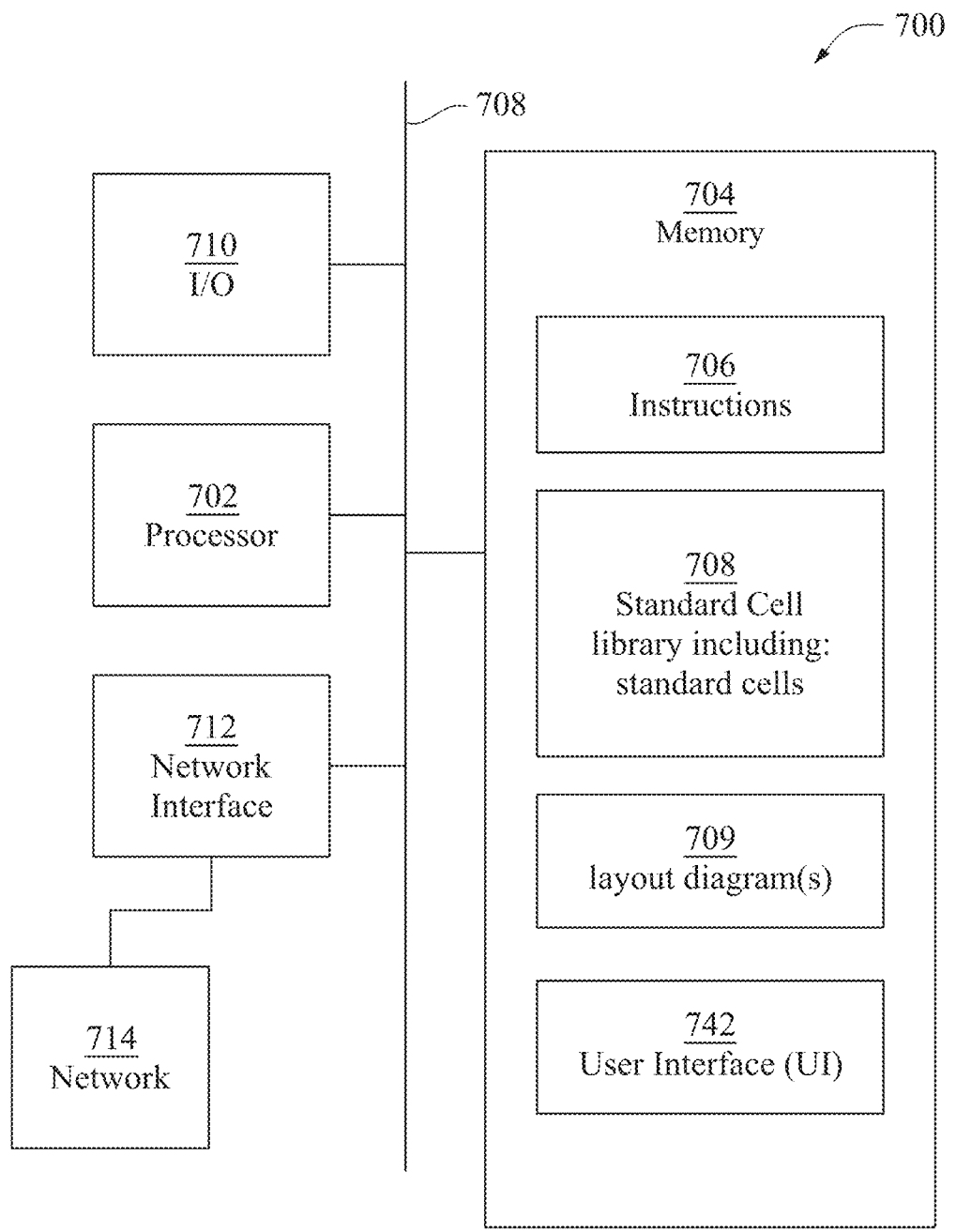
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an automatic placement and routing (APR) system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein. In one or more embodiments, storage medium 704 stores one or more layout diagrams 709 corresponding to one or more layouts disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
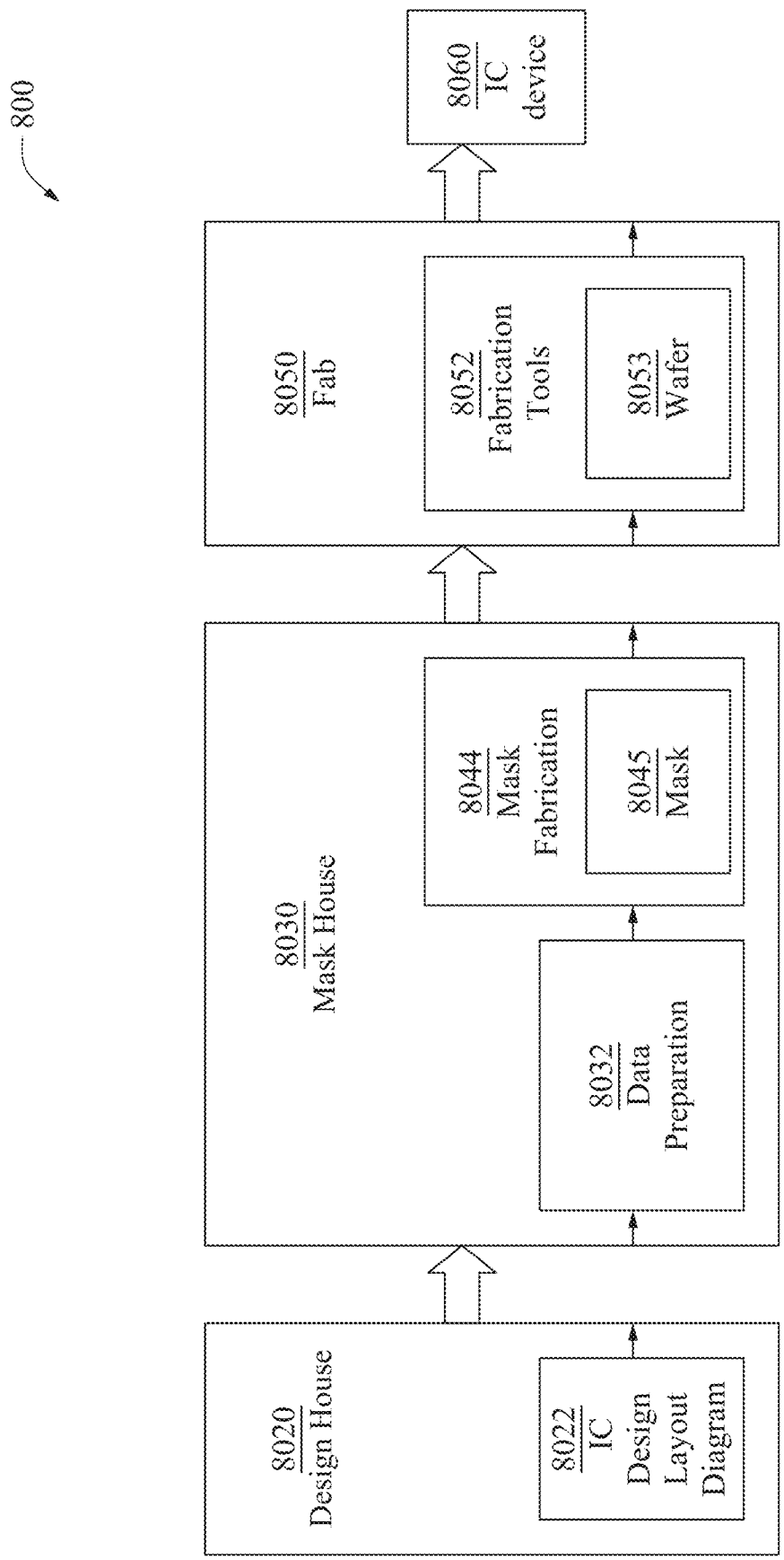
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 8020, a mask house 8030, and an IC manufacturer/fabricator ("fab") 8050, that interact with one another in the design, development, and manufacturing cycles and/or services related to manufacturing an IC device 8060. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 8020, mask house 8030, and IC fab 8050 is owned by a single larger company. In some embodiments, two or more of design house 8020, mask house 8030, and IC fab 8050 coexist in a common facility and use common resources.

Design house (or design team) 8020 generates an IC design layout diagram 8022. IC design layout diagram 8022 includes various geometrical patterns designed for an IC device 8060. The geometrical patterns correspond to patterns of metal, oxide, or semiconductor layers that make up the various components of IC device 8060 to be fabricated. The various layers combine to form various IC features. For example, a portion of IC design layout diagram 8022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 8020 implements a proper design procedure to form IC design layout diagram 8022. The design procedure includes one or more of logic design, physical design or place and route. IC design layout diagram 8022 is presented in one or more data files having information of the geometrical patterns. For example, IC design layout diagram 8022 can be expressed in a GDSII file format or DFII file format.

Mask house 8030 includes data preparation 8032 and mask fabrication 8044. Mask house 8030 uses IC design layout diagram 8022 to manufacture one or more masks 8045 to be used for fabricating the various layers of IC device 8060 according to IC design layout diagram 8022. Mask house 8030 performs mask data preparation 8032, where IC design layout diagram 8022 is translated into a representative data file ("RDF"). Mask data preparation 8032 provides the RDF to mask fabrication 8044. Mask fabrication 8044 includes a mask writer. A mask writer converts the RDF to an image on a substrate, such as a mask (reticle) 8045 or a semiconductor wafer 8053. The design layout diagram 8022 is manipulated by mask data preparation 8032 to comply with particular characteristics of the mask writer and/or requirements of IC fab 8050. In FIG. 8, mask data preparation 8032 and mask fabrication 8044 are illustrated as separate elements. In some embodiments, mask data preparation 8032 and mask fabrication 8044 can be collectively referred to as mask data preparation.

In some embodiments, mask data preparation 8032 includes optical proximity correction (OPC) which uses lithography enhancement techniques to compensate for image errors, such as those that can arise from diffraction, interference, other process effects and the like. OPC adjusts IC design layout diagram 8022. In some embodiments, mask data preparation 8032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 8032 includes a mask rule checker (MRC) that checks the IC design layout diagram 8022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 8022 to compensate for limitations during mask fabrication 8044, which may undo part of the modifications performed by OPC in order to meet mask creation rules.

In some embodiments, mask data preparation 8032 includes lithography process checking (LPC) that simulates processing that will be implemented by IC fab 8050 to fabricate IC device 8060. LPC simulates this processing based on IC design layout diagram 8022 to create a simulated manufactured device, such as IC device 8060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 8022.

It should be understood that the above description of mask data preparation 8032 has been simplified for the purposes of clarity. In some embodiments, data preparation 8032 includes additional features such as a logic operation (LOP) to modify the IC design layout diagram 8022 according to manufacturing rules. Additionally, the processes applied to IC design layout diagram 8022 during data preparation 8032 may be executed in a variety of different orders.

After mask data preparation 8032 and during mask fabrication 8044, a mask 8045 or a group of masks 8045 are fabricated based on the modified IC design layout diagram 8022. In some embodiments, mask fabrication 8044 includes performing one or more lithographic exposures based on IC design layout diagram 8022. In some embodiments, an electron-beam (e-beam) or a mechanism of multiple e-beams is used to form a pattern on a mask (photomask or reticle) 8045 based on the modified IC design layout diagram 8022. Mask 8045 can be formed in various technologies. In some embodiments, mask 8045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 8045 includes a transparent substrate (e.g., fused quartz) and an opaque material (e.g., chromium) coated in the opaque regions of the binary mask. In another example, mask 8045 is formed using a phase shift technology. In a phase shift mask (PSM) version of mask 8045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 8044 is used in a variety of processes. For example, such a mask(s) is used in an ion implantation process to form various doped regions in semiconductor wafer 8053, in an etching process to form various etching regions in semiconductor wafer 8053, and/or in other suitable processes.

IC fab 8050 is an IC fabrication business that includes one or more manufacturing facilities for the fabrication of a variety of different IC products. In some embodiments, IC Fab 8050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 8050 includes fabrication tools 8052 configured to execute various manufacturing operations on semiconductor wafer 8053 such that IC device 8060 is fabricated in accordance with the mask(s), e.g., mask 8045. In various embodiments, fabrication tools 8052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 8050 uses mask(s) 8045 fabricated by mask house 8030 to fabricate IC device 8060. Thus, IC fab 8050 at least indirectly uses IC design layout diagram 8022 to fabricate IC device 8060. In some embodiments, semiconductor wafer 8053 is fabricated by IC fab 8050 using mask(s) 8045 to form IC device 8060. In some embodiments, the IC fabrication includes performing one or more lithographic exposures based at least indirectly on IC design layout diagram 8022. Semiconductor wafer 8053 includes a silicon substrate or other proper substrate having material layers formed thereon. Semiconductor wafer 8053 further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: an active region; first, second and third metal-to-drain/source (MD) contact structures which extend in a first direction and correspondingly overlap the active region; a via-to-via (V2V) rail which extends in a second direction perpendicular to the first direction, and overlaps the first, second and third MD contact structures; a first conductive segment which overlaps the V2V rail, is in a first metallization layer, and, relative to the second direction, overlaps each of the first, second and third MD contact structures; and a first via-to-MD (VD) structure between the first MD contact structure and the first conductive segment, the first VD structure electrically coupling the first conductive segment, the V2V rail and the first MD contact structure; and wherein at least one of the second or third MD contact structures is electrically decoupled from the V2V rail.

In some embodiments, relative to the first direction, the second MD contact structure overlaps the V2V rail; and the semiconductor device further includes: relative to a third direction which is perpendicular to each of the first and second directions, dielectric material between the V2V rail and the second MD contact structure, the dielectric material electrically isolating the V2V rail from the second MD contact structure. In some embodiments, relative to the first direction, the first conductive segment is centered above the V2V rail. In some embodiments, relative to the first direction, each of the V2V rail and the first conductive segment is centered over the active region. In some embodiments, relative to the first direction, each of the V2V rail and the first conductive segment does not overlap the active region. In some embodiments, the active region is a first active region; the V2V rail is a first V2V rail; and the semiconductor device further includes: fourth, fifth and sixth MD contact structures which extend in the first direction, and correspondingly overlap the active region; a second V2V rail which extends in the second direction and overlaps the first and second MD contact structures; and a second conductive segment which is in the first metallization layer and overlaps the second V2V rail; and a third VD structure between the fourth MD contact structure and the second conductive segment, the third VD structure electrically coupling the second conductive segment, the second V2V rail and the fourth MD contact structure; a fourth VD structure between the sixth MD contact structure and the second conductive segment, the fourth VD structure electrically coupling the second conductive segment, the second V2V rail and the sixth MD contact structure; and wherein the fifth MD contact structure is electrically decoupled from the second V2V rail. In some embodiments, the semiconductor device further includes first and second gate structures which extend in the first direction and correspondingly overlap the active region, and wherein: the first gate structure is interposed between the first and second MD contact structures; and the second gate structure is interposed between the second and third MD contact structures. In some embodiments, relative to the first direction, at least one of the second or third MD contact structure does not overlap the V2V rail, correspondingly resulting in the second or third MD contact structure being electrically decoupled from the V2V rail. In some embodiments, relative to the first direction, the V2V rail overlaps the second MD contact structure; and the semiconductor device further includes: a second VD structure between the third MD contact structure and the first conductive segment, the second VD structure electrically coupling the first conductive segment, the V2V rail and the third MD contact structure; and relative to the second direction, the second MD contact structure is between the first and third and MD contact structures.

In some embodiments, a semiconductor device includes: first and second active regions extending in a first direction; first and second metal-to-drain/source (MD) contact structures which extend in a second direction perpendicular to the first direction, and correspondingly overlap the first and second active regions; a via-to-via (V2V) rail which extends in the first direction, and overlaps the first and second MD contact structures; a first conductive segment which is in a first metallization layer and overlaps the V2V rail; a first via-to-MD (VD) structure between the first MD contact structure and the first conductive segment, the first VD structure electrically coupling the first conductive segment, the V2V rail and the first MD contact structure; and wherein the second MD contact structure is electrically decoupled from the V2V rail.

In some embodiments, relative to the second direction, the V2V rail is between the first and second active regions. In some embodiments, relative to the second direction, the first conductive segment is centered above the V2V rail. In some embodiments, the V2V rail is a first V2V rail; and relative to the second direction, the V2V rail overlaps the first active region. In some embodiments, the V2V rail is a first V2V rail, and the semiconductor device further includes: a second V2V rail which extends in the first direction, and overlaps the first and second MD contact structures, and overlaps the second active region; and a second conductive segment which is in the first metallization layer and overlaps the second V2V rail. In some embodiments, relative to the second direction, the first conductive segment is centered above the first V2V rail.

In some embodiments, a method (of forming a semiconductor device) includes: forming an active region; forming first, second and third metal-to-drain/source (MD) contact structures which extend in a first direction, and correspondingly overlap and electrically couple to the active region; forming a first via-to-MD (VD) structure over, and electrically coupled to, the first MD contact structure; forming a via-to-via (V2V) rail which extends in a second direction perpendicular to the first direction, overlaps the first MD contact structure and at least one of the second or third MD contact structures, and is electrically coupled to the first VD structure; relative to a third direction which is perpendicular to each of the first and second directions, setting an upper surface of the V2V rail so as to not project beyond an upper surface of the first VD structure, and setting a lower surface of the V2V rail so that first, second and third gaps remain correspondingly between the lower surface of the V2V rail and upper surfaces correspondingly of first, second and third MD contact structures; and forming a first conductive segment which overlaps the V2V rail, is in a first metallization layer, and is electrically coupled to the first VD structure; and wherein at least one of the second and third MD contact structures is electrically decoupled from the V2V rail correspondingly by the second or third gaps.

In some embodiments, the method further includes: forming a second VD structure over the third MD contact structure, and electrically coupled to the third MD contact structure, the first conductive segment and the V2V rail. In some embodiments, relative to the first direction, the V2V rail also overlaps the third MD contact structure, and the method further includes: forming a second VD structure over the third MD contact structure, and electrically coupled to the third MD contact structure, the first conductive segment and the V2V rail; and relative to the second direction, the second MD contact structure is between the first and third and MD contact structures. In some embodiments, relative to the first direction, the V2V rail overlaps the second MD contact structure, and the method further includes: relative to a third direction which is perpendicular to each of the first and second directions, forming dielectric material between the V2V rail and at least one of the second or third MD contact structures, the dielectric material electrically isolating the V2V rail correspondingly from the second or third MD contact structure. In some embodiments, the method further includes: relative to the first direction, centering the first conductive segment above the V2V rail. In some embodiments, the method further includes: relative to the first direction, centering each of the V2V rail and the first conductive segment over the active region. In some embodiments, the method further includes: relative to the first direction, locating each of the V2V rail and the first conductive segment so as to not overlap the active region. In some embodiments, the method further includes: forming first and second gate structures which extend in the first direction and correspondingly overlap the active region; interposing the first gate structure between the first and second MD contact structures; and interposing the second gate structure between the second and third MD contact structures.

In some embodiments, a semiconductor device includes: an active region; first, second and third metal-to-drain/source (MD) contact structures which extend in a first direction and correspondingly overlap the active region; a via-to-via (V2V) rail which extends in a second direction perpendicular to the first direction, and overlaps the first, second and third MD contact structures; a first conductive segment which overlaps the V2V rail and is in a first metallization layer; a first via-to-MD (VD) structure between the first MD contact structure and the first conductive segment, the first VD structure electrically coupling the first conductive segment, the V2V rail and the first MD contact structure; a second VD structure between the third MD contact structure and the first conductive segment, the second VD structure electrically coupling the first conductive segment, the V2V rail and the third MD contact structure; and wherein the second MD contact structure is electrically decoupled from the V2V rail.

In some embodiments, relative to the first direction, the second MD contact structure overlaps the V2V rail, and the semiconductor device further includes: relative to a third direction which is perpendicular to each of the first and second directions, dielectric material between the V2V rail and the second MD contact structure, the dielectric material electrically isolating the V2V rail from the second MD contact structure. In some embodiments, relative to the first direction, the first conductive segment is centered above the V2V rail. In some embodiments, relative to the first direction, each of the V2V rail and the first conductive segment is centered over the active region. In some embodiments, relative to the first direction, each of the V2V rail and the first conductive segment does not overlap the active region. In some embodiments, the active region is a first active region, the V2V rail is a first V2V rail, and the semiconductor device further includes: fourth, fifth and sixth MD contact structures which extend in the first direction, and correspondingly overlap the active region; a second V2V rail which extends in the second direction and overlaps the first and second MD contact structures; and a second conductive segment which is in the first metallization layer and overlaps the second V2V rail; and a third VD structure between the fourth MD contact structure and the second conductive segment, the third VD structure electrically coupling the second conductive segment, the second V2V rail and the fourth MD contact structure; a fourth VD structure between the sixth MD contact structure and the second conductive segment, the fourth VD structure electrically coupling the second conductive segment, the second V2V rail and the sixth MD contact structure; and wherein the fifth MD contact structure is electrically decoupled from the second V2V rail. In some embodiments, the semiconductor device further includes first and second gate structures which extend in the first direction and correspondingly overlap the active region, and wherein: the first gate structure is interposed between the first and second MD contact structures; and the second gate structure is interposed between the second and third MD contact structures.

In some embodiments, a method (of forming a semiconductor device) includes: forming an active region; forming first, second and third metal-to-drain/source (MD) contact structures which extend in a first direction, and correspondingly overlap and electrically couple to the active region; forming a via-to-via (V2V) rail which extends in a second direction perpendicular to the first direction so as to overlap at least the first MD contract structure and third MD contact structures; relative to a third direction which is perpendicular to each of the first and second directions, setting a lower surface of the V2V rail so that first, second and third gaps remain correspondingly between the lower surface of the V2V rail and the first, second and third MD contact structures; forming a first via-to-MD (VD) structure over, and electrically coupled to, the first MD contact structure and the V2V rail; forming a second VD structure over, and electrically coupled to, the third MD contact structure and the V2V rail; and forming a first conductive segment which overlaps the V2V rail, is in a first metallization layer, and is electrically coupled to at least the first and second VD structures; and wherein the second MD contact structure is electrically decoupled from the V2V rail by the second gap.

In some embodiments, relative to the first direction, the V2V rail overlaps the second MD contact structure, and the method further includes: relative to a third direction which is perpendicular to each of the first and second directions, forming dielectric material between the V2V rail and the second MD contact structure, the dielectric material electrically isolating the V2V rail from the second MD contact structure. In some embodiments, the method further includes: relative to the first direction, centering the first conductive segment centered above the V2V rail. In some embodiments, the method further includes: relative to the first direction, centering each of the V2V rail and the first conductive segment over the active region. In some embodiments, the method further includes: relative to the first direction, locating each of the V2V rail and the first conductive segment so as to not overlap the active region. In some embodiments, the method further includes: forming first and second gate structures which extend in the first direction and correspondingly overlap the active region; interposing the first gate structure between the first and second MD contact structures; and interposing the second gate structure between the second and third MD contact structures. In some embodiments, the method further includes: relative to a third direction which is perpendicular to each of the first and second directions, setting upper surfaces correspondingly of the first and second VD structures so as to not be recessed with respect to an upper surface of the V2V rail.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
    an active region;
    first, second and third metal-to-drain/source (MD) contact structures which extend in a first direction and correspondingly overlap the active region;
    a via-to-via (V2V) rail which extends in a second direction perpendicular to the first direction, the V2V rail overlapping the first, second and third MD contact structures;
    a first conductive segment which overlaps the V2V rail, the first conductive segment being in a first metallization layer and, relative to the second direction, overlapping each of the first, second and third MD contact structures; and
    a first via-to-MD (VD) structure between the first MD contact structure and the first conductive segment, the first VD structure electrically coupling the first conductive segment, the V2V rail and the first MD contact structure, and
    wherein at least one of the second or third MD contact structures is electrically decoupled from the V2V rail.

2. The semiconductor device of claim 1, wherein:
    relative to the first direction, the second MD contact structure overlaps the V2V rail; and
    the semiconductor device further comprises:
        relative to a third direction which is perpendicular to each of the first and second directions, dielectric material between the V2V rail and the second MD contact structure, the dielectric material electrically isolating the V2V rail from the second MD contact structure.

3. The semiconductor device of claim 1, wherein:
    relative to the first direction, the first conductive segment is centered above the V2V rail.

4. The semiconductor device of claim 1, wherein:
    relative to the first direction, each of the V2V rail and the first conductive segment is centered over the active region.

5. The semiconductor device of claim 1, wherein:
    relative to the first direction, each of the V2V rail and the first conductive segment does not overlap the active region.

6. The semiconductor device of claim 1, wherein:
    the active region is a first active region;
    the V2V rail is a first V2V rail; and
    the semiconductor device further comprises:
        fourth, fifth and sixth MD contact structures which extend in the first direction, and correspondingly overlap the active region;
        a second V2V rail which extends in the second direction and overlaps the first and second MD contact structures; and
        a second conductive segment which is in the first metallization layer and overlaps the second V2V rail; and
    a second VD structure between the fourth MD contact structure and the second conductive segment, the second VD structure electrically coupling the second conductive segment, the second V2V rail and the fourth MD contact structure; and
    a third VD structure between the sixth MD contact structure and the second conductive segment, the third VD structure electrically coupling the second conductive segment, the second V2V rail and the sixth MD contact structure, and
    wherein the fifth MD contact structure is electrically decoupled from the second V2V rail.

7. The semiconductor device of claim 1, further comprising:
    first and second gate structures which extend in the first direction and correspondingly overlap the active region, and
    wherein:
        the first gate structure is interposed between the first and second MD contact structures, and
        the second gate structure is interposed between the second and third MD contact structures.

8. The semiconductor device of claim 1, wherein:
    relative to the first direction, at least one of the second or third MD contact structure does not overlap the V2V rail.

9. The semiconductor device of claim 1, wherein:
    relative to the first direction, the V2V rail overlaps the second MD contact structure; and
    the semiconductor device further comprises:
        a second VD structure between the third MD contact structure and the first conductive segment, the second VD structure electrically coupling the first conductive segment, the V2V rail and the third MD contact structure; and
    relative to the second direction, the second MD contact structure is between the first and third and MD contact structures.

10. A semiconductor device comprising:
    first and second active regions extending in a first direction;
    first and second metal-to-drain/source (MD) contact structures which extend in a second direction perpendicular to the first direction, and correspondingly overlap the first and second active regions;
    a via-to-via (V2V) rail which extends in the first direction, the V2V rail overlapping the first and second MD contact structures;
    a first conductive segment which is in a first metallization layer and overlaps the V2V rail; and
    a first via-to-MD (VD) structure between the first MD contact structure and the first conductive segment, the first VD structure electrically coupling the first conductive segment, the V2V rail and the first MD contact structure; and wherein the second MD contact structure is electrically decoupled from the V2V rail.

11. The semiconductor device of claim 10, wherein:
relative to the second direction, the V2V rail is between the first and second active regions.

12. The semiconductor device of claim 11, wherein:
relative to the second direction, the first conductive segment is centered above the V2V rail.

13. The semiconductor device of claim 10, wherein:
the V2V rail is a first V2V rail, and
relative to the second direction, the V2V rail overlaps the first active region.

14. The semiconductor device of claim 13, wherein:
the V2V rail is a first V2V rail, and
the semiconductor device further comprises:
 a second V2V rail which extends in the first direction, and overlaps the first and second MD contact structures, and overlaps the second active region; and
 a second conductive segment which is in the first metallization layer and overlaps the second V2V rail.

15. The semiconductor device of claim 13, wherein:
relative to the second direction, the first conductive segment is centered above the first V2V rail.

16. A semiconductor device comprising:
an active region;
first, second and third metal-to-drain/source (MD) contact structures which extend in a first direction and correspondingly overlap the active region;
a via-to-via (V2V) rail which extends in a second direction substantially perpendicular to the first direction, and overlaps the first, second and third MD contact structures;
a first conductive segment which overlaps the V2V rail, is in a first metallization layer, and, relative to the second direction, substantially overlaps each of the first, second and third MD contact structures;
a first via-to-MD (VD) structure between the first MD contact structure and the first conductive segment, the first VD structure electrically coupling the first conductive segment, the V2V rail and the first MD contact structure; and
first and second gate structures which extend in the first direction and correspondingly overlap the active region; and
wherein:
 at least one of the second or third MD contact structures is electrically decoupled from the V2V rail;
 the first gate structure is interposed between the first and second MD contact structures; and
 the second gate structure is interposed between the second and third MD contact structures.

17. The semiconductor device of claim 16, wherein:
relative to the first direction, the second MD contact structure overlaps the V2V rail; and
the semiconductor device further comprises:
 relative to a third direction which is substantially perpendicular to each of the first and second directions, dielectric material between the V2V rail and the second MD contact structure, the dielectric material electrically isolating the V2V rail from the second MD contact structure.

18. The semiconductor device of claim 16, wherein:
relative to the first direction, the first conductive segment is substantially centered above the V2V rail.

19. The semiconductor device of claim 16, wherein:
relative to the first direction, each of the V2V rail and the first conductive segment is substantially centered over the active region.

20. The semiconductor device of claim 16, wherein:
relative to the first direction, each of the V2V rail and the first conductive segment substantially does not overlap the active region.

* * * * *